HIGH GAIN AMPLIFIER CIRCUIT

Filed April 18, 1967

BERNARD J. SULLIVAN
INVENTOR.

BY Charles C. Krawczyk

ATTORNEY

United States Patent Office 3,465,260

Patented Sept. 2, 1969

3,465,260

HIGH GAIN AMPLIFIER CIRCUIT

Bernard J. Sullivan, Rochester, N.Y., assignor to Bausch & Lomb Incorporated, Rochester, N.Y., a corporation of New York Filed Apr. 18, 1967, Ser. No. 631,635
Int. Cl. H03f *3/18*
U.S. Cl. 330—17 2 Claims

ABSTRACT OF THE DISCLOSURE

An amplifier circuit including two cascade connected semiconductor amplifying stages with a positive feedback circuit for increasing the gain of the first stage. The amplifiers comprise field-effect transistors of complementary types and the feedback is connected from the source electrode of the output transistor to the junction of two resistors which are connected to the drain electrode of the input transistor.

Background of the invention

This invention relates to amplifier circuits including a positive signal feedback circuit.

In the design of electronic amplifier circuits it is desirable to design the gain of the first stage as high as possible. This significantly increases the amplifier signal-to-noise ratio so that the internally generated noise of the subsequent amplifier stages due to thermal and shot noise effects, etc., can be minimized.

The gain of a stage is generally determined by the operating conditions of the amplifying device, the size of the load impedance, and the magnitude of the available power supply source. The quescient operating conditions of the amplifying device are selected for maximum gain, transconductance etc., within the power capabilities of the device. The load for the device is subsequenty selected by the magnitude of the available power supply. This becomes a particular problem with semiconductor devices since relatively low power supply voltages are employed to protect the amplifying devices against breakdown due to transients. Since the power supply voltage is low, the size of the load impedance is also limited thereby limiting the available gain from an amplifier stage when designed in the conventional manner.

It is therefore an object of this invention to provide a new and improved amplifier circuit including a high gain input stage.

It is also an object of this invention to provide a new and improved amplifier circuit including a position feedback circuit for increasing the gain of the first stage.

Summary of the invention

The amplifier circuit of the invention includes two amplifying devices each including first and a second electrodes and means for controlling the current flow between the first and second electrodes. The first amplifying device, for example, may be a photosensitive device or alternatively an electrical semiconductor transistor. Circuit means are provided to connect the first and second electrodes of the amplifying devices between a power supply terminal and a reference point that are adapted to be connected to a source of energizing potential. Means are provided for applying an input signal, to the first device for the amplification thereof. The amplified input signal is coupled to a control electrode of the second device. A positive feedback circuit is coupled between the controlled current paths of the first and second devices in a manner that increases the gain of the circuit including the first device.

Description of the preferred embodiment

Figure 1:
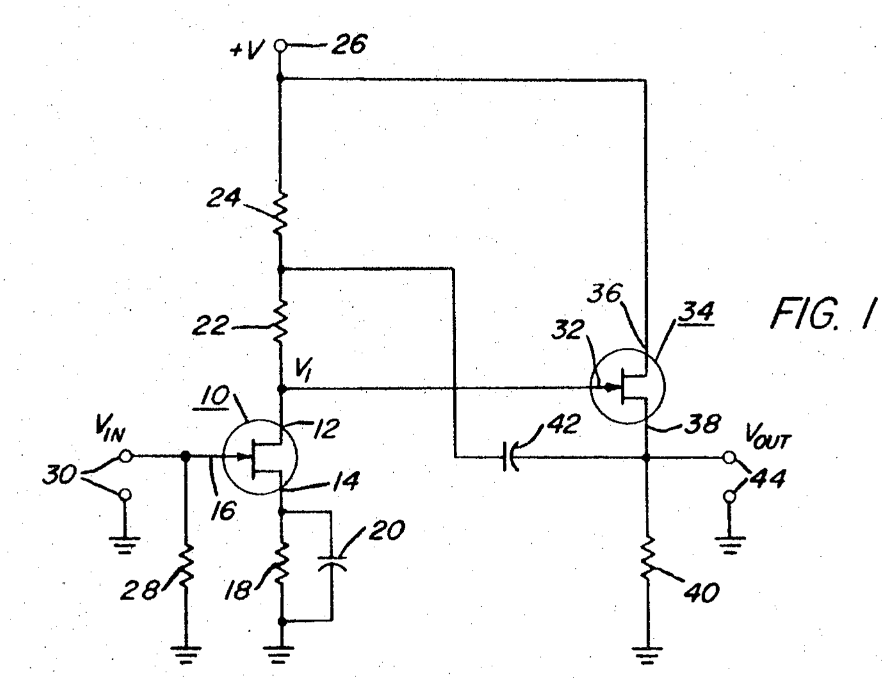
FIG. 1 is an electrical schematic diagam of a first embodiment of an amplifier circuit of the invention.

The amplifying circuit of FIGURE 1 includes a first amplifying device, illustrated as a field-effect transistor 10, having a drain electrode 12, a source electrode 14 and a gate electrode 16 for controlling the current flow between the drain and source electrodes, connected as the first stage of the amplifying circuit. The source electrode 14 is connected through a parallel biasing circuit including a resistor 18 and a by-pass capacitor 20 to a reference point illustrated as ground. The drain electrode 12 is connected through two series resistors 22 and 24 to a terminal 26 adapted to be connected to a source of energizing potential. The gate electrode 16 is connected to ground through a biasing resistor 28. Signals to be amplified ($V_{in}$) are applied across a pair of input terminals 30 connected between ground and the gate electrode 16.

The drain electrode 12 of the field-effect transistor 10 is directly connected to the gate electrode 32 of a similar amplifying device illustrated as a second field-effect transistor 34. The drain electrode 36 of the field-effect transistor 34 is directly connected to the power supply terminal 26 while the source electrode 38 is connected to ground through a resistor 40. A capacitor 42 is connected between the source electrode 38 and the junction of the resistors 22 and 24 providing a positive signal feedback path for increasing gain of the first stage of the amplifier circuit. The amplified output signals ($V_{out}$) are developed across a pair of output terminals 44.

In operation, the signal $V_{in}$ applied to the input terminals 30 is developed in an amplified form across the resistors 22 and 24, and is directly coupled to the gate electrode 32 of the field effect transistor 34. The signal developed across the resistor 40 is in phase with that developed across the resistors 22 and 24. The inphase signal from the resistor 40 is coupled through the capacitor 42 to the junction of the resistors 22 and 24 in a manner to aid the amplifying action of the first stage. For example, if the voltage drop across the resistors 22 and 24 is increasing due to an increase in current through the transistor 10, the signal coupled through the capacitor 42 is of a polarity to increase the current flow through the resistor 24 thereby further increasing the voltage drop across the resistor 24 and the signal at the drain electrode 12. If the voltage drop across the resistors 22 and 24 is decreasing, the signal coupled through the capacitor 42 is of a polarity to further decrease the current flow. The effect of the positive feedback is to increase the effective signal impedance of the resistor 24 while keeping direct current resistance of the resistors 22 and 24 at a lower value.

In the mathematical analysis of the circuit of FIGURE 1, the various components are designated by a letter designating the type of component with its reference numeral as a subscript.

$$V_{out}=(V_1-V_{out})gm_{34}R_{L2} \quad (1)$$

where:

$gm_{34}$=the transconductance of the transistor 34
$R_{L2}$=the parallel combination of resistors 40 and 24
$V_1$=voltage applied to the gate of the transistor 34

Accordingly:

$$V_{out}=V_1G_2 \quad (2)$$

where:

$$G_2=\frac{R_{L2}gm_{34}}{1+gm_{34}R_{L2}} \quad (3)$$

$$V_1=V_{in}gm_{10}R_{L1} \quad (4)$$

where:

$gm_{10}$=the transconductance of the transistor 10
$R_{L1}$=the drain load resistance of the transistor 10

$$R_{L1}=V_1/I_{10} \quad (5)$$

where: $I_{10}$=the current through the transistor 10

$$I_{10}=\frac{V_1V_{out}-}{R_{22}} \quad (6)$$

Substituting Equation 2 into Equation 6 we have:

$$I_{10}=\frac{V_1}{R_{22}}(1-G_2) \quad (7)$$

Substituting Equation 7 into Equation 5 we have:

$$R_{L1}=\frac{R_{22}}{1-G_2} \quad (8)$$

The gain of the first stage is:

$$V_1/V_{in}=gm_{10}R_{L1} \quad (9)$$

Substituting Equation 8 into Equation 9 we have:

$$\frac{V_1}{V_{in}}=\frac{gm_{10}R_{22}}{1-G_2} \quad (10)$$

As can be seen from Equation 10 the gain of the first stage is increased by increasing the value of $G_2$.

Figure 2:
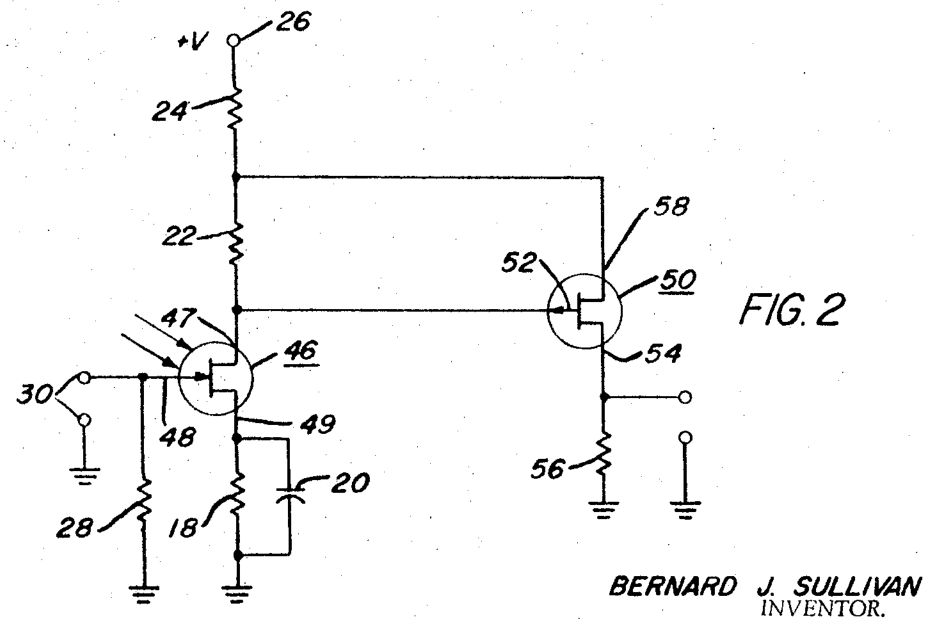
FIG. 2 is an electrical schematic diagram of a second embodiment of an amplifier circuit of the invention.

In the second embodiment of the amplifier circuit of FIGURE 2, a photoelectric field-effect transistor 46 having drain, gate and source electrodes 47, 48 and 49 respectively, is connected in the same manner as the transistor 10 of FIGURE 1. The same components of FIGURES 1 and 2 are designated by the same reference numerals. Although a photoelectric field-effect transistor is illustrated in FIGURE 2, it is to be understood that other types of photoelectric devices such as photodiodes, photoresistors, etc., can also be used. Electrical signals or radiation type signals, or both, can be applied to the photoelectric field effect transistor 46 and the signals are amplified accordingly.

The second stage includes a field-effect transistor 50 that is complementary type to that of the field-effect transistors 46 and 10. The gate electrode 52 of the transistor 50 is directly connected to the drain electrode 47 of the transistor 46, its drain electrode 54 is connected to ground through a resistor 56, and its source electrode 58 is connected to the junction of the resistors 22 and 24. This connection between the junction resistors 22 and 24 and the source electrode 58 provides a direct current positive feedback path rather than the alternating current feedback path provided by the capacitor 42 of FIGURE 1. The feedback path increases the gain of the first stage (including transistor 46) in a similar manner as FIGURE 1.

What is claimed is:

1. An amplifier circuit comprising:
first and second field effect transistors of complementary types;
first and second terminals for connection to a source of unidirectional energizing potential;
a pair of series resistors connected between the drain electrode of said first transistor and said first terminal;
a biasing circuit coupled between said source electrode of said first transistor and said second terminal;
an input circuit coupled to the gate electrode of said first transistor for applying signals to be amplified;
circuit means providing a direct current connection between the gate electrode of said second transistor and the drain electrode of said first transistor;
an output circuit connected between the drain electrode of said second transistor and said second terminal for developing amplified output signals; and
circuit means providing a direct current connection between the source electrode of said second transistor and the junction of said series resistors as a positive feedback circuit.

2. A photoelectric amplifier circuit which comprises:
a radiation sensitive field effective transistor;
a second field effect transistor of an opposite conductivity type than said photoelectric transistor;
a pair of terminals for connection to a source of unidirectional energizing potential;
a pair of series resistors connected between the drain electrode of said photoelectric transistor and said first terminal;
a biasing circuit coupled between said source electrode of said photoelectric transistor and said second terminal;
means for applying radiation to said photoelectric transistor for providing signals to be amplified;
circuit means for providing a direct current connection between the gate electrode of said second transistor and the drain electrode of said photoelectric transistor;
an output circuit connected between the drain electrode of said second transistor and said second terminal for developing amplified output signals; and
circuit means for providing a direct current connection between source electrode of said second transistor and the junction of said series resistors as a positive feedback circuit.

References Cited

UNITED STATES PATENTS

| | | | |
|---|---|---|---|
| 3,209,083 | 9/1965 | Posen | 330—17 X |
| 3,262,061 | 7/1966 | Kahn | 330—17 |
| 3,300,585 | 1/1967 | Reedyk et al. | 330—38 |
| 3,379,987 | 4/1968 | Volkers | 330—17 |

OTHER REFERENCES

King, "A Single Stage Amplifier for Repetitive Ana- 1964 pp. 770–771.

Lott, "Fet Increases Schmitt Trigger Input Impedance," Electronics, July 26, 1965 p. 65.

"Using Photo Field-Effect Transistors," Electronic Design Nov. 22, 1963, p. 76.

ROY LAKE, Primary Examiner

JAMES B. MULLINS, Assistant Examiner

U.S. Cl. X.R.

330—26, 38, 33, 112, 156